United States Patent [19]

Tschang et al.

[11] Patent Number: 4,997,680
[45] Date of Patent: Mar. 5, 1991

[54] POLYMERIC CONDITIONER FOR PRETREATING NONMETALLIC SURFACES FOR CHEMICAL METALLIZATION

[75] Inventors: Chung-Ji Tschang, Bad Durkheim; Johannes P. Dix, Neuhofen; Ekhard Winkler, Mutterstadt; Guenther Gotsmann, Frankenthal; Klaus Glaser, Mutterstadt; Rolf Fikentscher, Ludwigshafen, all of Fed. Rep. of Germany

[73] Assignee: BASF Aktiengesellschaft, Ludwigshafen, Fed. Rep. of Germany

[21] Appl. No.: 288,623

[22] Filed: Dec. 22, 1988

[30] Foreign Application Priority Data

Dec. 23, 1987 [DE] Fed. Rep. of Germany ....... 3743741

[51] Int. Cl.$^5$ .............................................. C23C 26/00
[52] U.S. Cl. .................................. 427/306; 427/304; 427/305
[58] Field of Search ...................... 417/306, 305, 304

[56] References Cited

U.S. PATENT DOCUMENTS

| 3,562,038 | 2/1971 | Shipley | 427/304 |
| 3,684,572 | 8/1972 | Taylor . | |
| 4,309,462 | 1/1982 | Dillard | 427/306 |
| 4,315,045 | 2/1982 | Dillard | 427/306 |
| 4,335,164 | 6/1982 | Dillard | 427/306 |
| 4,478,883 | 10/1984 | Bupp | 427/306 |
| 4,560,643 | 12/1985 | Finter | 427/305 |
| 4,704,132 | 11/1987 | Fikentscher . | |
| 4,781,990 | 11/1988 | Grapentin | 427/306 |

FOREIGN PATENT DOCUMENTS

| 3621410 | 1/1987 | Fed. Rep. of Germany . |
| 3530617 | 2/1987 | Fed. Rep. of Germany . |
| 2154251 | 9/1985 | United Kingdom . |

*Primary Examiner*—Shrive Beck
*Assistant Examiner*—Vi Duong Dang
*Attorney, Agent, or Firm*—Oblon, Spivak, McClelland, Maier & Neustadt

[57] ABSTRACT

Polymeric, unquaternized or quaternized condensates which contain piperazine rings bonded via chain members are used as conditioners for the pretreatment of nonmetallic surfaces of moldings before their activation for subsequent chemical metallization. This procedure gives particularly uniform and well adhering metal coatings.

8 Claims, No Drawings

POLYMERIC CONDITIONER FOR PRETREATING NONMETALLIC SURFACES FOR CHEMICAL METALLIZATION

The present invention relates to the use of polymeric condensates which contain piperazine rings and may be in the form of their quaternary salts as conditioners for the pretreatment before nucleation of nonmetallic surfaces of moldings for subsequent complete and uniform metallization.

The chemical metallization of the surfaces of nonmetallic materials serves as a rule to produce a decorative effect, to protect the surface or to make the surface electrically conductive. Examples of this are the nickel-plating (and subsequent electrochemical chromium-plating) of plastic components in automotive construction, and the chemical copper-coating of printed circuit boards for electrical and electronic equipment. Chemical metallization is carried out in a plurality of steps. In the case of chemical copper-coating of printed circuit boards (especially for through-hole plating), these steps are cleaning, etching of the copper coating, the pre-dip for protecting the subsequent bath, nucleation with a palladium or copper colloid (also referred to as activation), the removal of excess colloid (also referred to as stripping) and finally the actual chemical copper-coating. A uniform and complete copper coating is desirable. Experience has shown that problems sometimes occur during copper-coating of holes, due to the fact that the copper sleeve chemically deposited in the hole has small holes or does not adhere to one or more areas of the base material of the printed circuit board (detachment from hole wall), which leads to defective contacts when components are soldered in. Similar problems can also be encountered in the coating of nonmetallic surfaces with other metals. It is therefore, necessary during chemical copper-coating and of course also during the other chemical metallization processes to achieve a very high degree of freedom from pores and very good adhesion.

This is only ensured if the surface to be metallized can be uniformly coated with colloid during activation. For example, with glass fiber-reinforced epoxy resin boards, this is, however, frequently not the case since fibers of the laminate project into the hole, resulting in weak areas or even holes in the deposited copper.

Activation of the surface with a colloid can be improved if the article to be metallized is pretreated with a conditioner. The purpose of this conditioner is to improve the wettability of the surface and the adsorptivity with respect to the colloid. The conditioner can be applied in the cleaner, in a separate bath afterward or in the pre-dip (bath prior to activation). It is most advantageously used in the cleaner.

Many suggestions have already been made with regard to the nature of the conditioner. For example, U.S. Pat. No. 3,684,572 envisages the use of a surfactant having a quaternary amino group. British Patent Application No. 2,154,251 describes the use of an organic amine sensitizer which, on the basis of the examples, includes, in particular, (2,3-epoxypropyl)-trimethylammonium chloride and 2,3-dihydroxypropyl-trimethylammonium chloride, but, according to the general formula, also certain low molecular weight derivatives of pyridine and imidazole in quaternized form. German Laid-Open Application DOS No. 3,530,617 finally discloses, as conditioners, quaternized heterocycles, such as imidazole or benzimidazole, which have a vinyl or allyl group on the nitrogen atom. The abovementioned conditioners have the disadvantage that their adsorption on the surface of the material to be metallized is not optimal, and that the last-mentioned publication discloses ethylenically unsaturated monomers, which require particularly careful handling owing to their toxicity.

Cationic polymers, in particular those which have a polyacrylamide backbone with attached tetraalkylammonium groups, are recommended as conditioners in U.S. Pat. No. 4,478,883. We have found that polymers of this type have only a moderate action.

It is an object of the present invention to provide conditioners for pretreating nonmetallic materials for subsequent metallization, which have optimal adhesion to the surface and, properly produced, can be very safely handled.

We have found that this object is achieved by the use of the polymeric conditioners which have the structures

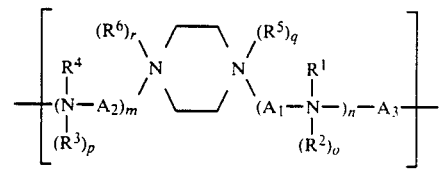

where $A_1$ and $A_2$ are each $C_2$–$C_4$-alkylene, $A_3$ is unsubstituted or hydroxyl-substituted $C_2$–$C_4$-alkylene, $R^1$ and $R^4$ are each hydrogen, $C_1$–$C_{12}$-alkyl, or benzyl, $R^2$ and $R^3$ are each $C_1$–$C_{12}$alkyl or benzyl, $R^5$ and $R^6$ are each $C_1$–$C_{12}$-alkyl, hydroxylsubstituted $C_2$–$C_{12}$-alkyl or benzyl and n, m, o, p, q and r are each zero or 1; or

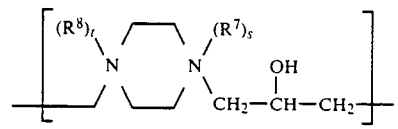

wherein $R^7$ and $R^8$ independently of one another are each $C_1$–$C_{12}$alkyl or benzyl and s and t independently of one another are each zero or 1.

The substances to be used according to the invention are known or can be obtained in a known manner, for example according to German Laid-Open Applications DOS No. 3,526,101 (=U.S. Pat. No. 4,704,132) and DOS No. 3,621,410.

Suitable starting materials are (a) piperazine and its derivatives which are substituted at one or both nitrogen atoms, such as 1,4-bis-(3-aminopropyl)-piperazine, 1-(2-aminoethyl)-piperazine, 1-(2-hydroxyethyl)piperazine, 1,4-bisbenzylpiperazine and 1-methylpiperazine, and (b) alkylene derivatives which contain two groups which react with the nitrogen atoms of the piperazine ring, such as ethylene chloride, epichlorohydrin, epibromohydrin, 1,2-propylene chloride, 1,3-propylene chloride, 1,3-dichlorohydroxypropane, bisepoxybutane and 1,4-dichlorobutane.

The starting materials can be reacted with one another in a molar ratio (a:b) of from 1:0.5 to 1:1.1, preferably from 1:0.8 to 1:1.0, particularly preferably from 1:0.9 to 1:0.96, in accordance with the abovementioned laid-open applications. The condensates thus obtained can, if desired, be quaternized, the usual quaternization agents, for example dialkyl sulfates, such as dimethyl or diethyl sulfate, or alkyl or benzyl halides, such as butyl bromide, hexyl bromide, ethylhexyl bromide, n-octyl bromide, n-dodecyl bromide, benzyl bromide or the corresponding chlorides, being used.

Up to 100% of the nitrogen atoms in the substances to be used according to the invention can be quaternized with $C_1$–$C_{12}$-alkyl groups and/or up to 80% with benzyl groups, provided that the quaternization products are soluble in the aqueous bath used. The required degree of solubility depends on the desired concentration for use. A solubility of not less than 1% by weight in the bath is sufficient in all circumstances and therefore preferred.

If the substances to be used according to the invention are in the form of quaternary salts, their quaternary nitrogen atoms can in principle be compensated by any acid anions, provided that these do not have an adverse effect on the solubility of the polymeric salts or, because of their reactivity, cause problems during use. For the sake of simplicity, the polymeric salts generally contain the anions originating from the quaternization agents which have been used in their preparation, ie. preferably chloride, bromide, methosulfate or ethosulfate ions.

The molecular weight of the polymers to be used according to the invention has no pronounced effect on their action. It may be assumed that molecular weights of about 1,500 or higher are sufficient. Particularly high molecular weight polymers have no advantages but may be used. Molecular weights of from 1,900 to 50,000 can readily be achieved during the condensation and are therefore preferred.

The polymeric conditioners described above are used, according to the invention, in a bath in which the article to be metallized, eg. a printed circuit board, is dipped. Spraying of the article with the solution of the conditioner is also possible. The solution of the conditioner is aqueous, ie. it contains, as a solvent, either only water or predominantly water in addition to other water-miscible liquids, such as alcohols. The treatment of the nonmetallic article must be carried out prior to activation by the palladium or copper colloid, since it is otherwise ineffective. The conditioner is most advantageously used in the cleaning bath. In the other baths, there is a danger of damaging the conditioner (for example in the etching bath) or adversely affecting the solubility by salts (for example in the pre-dip, an electrolyte-containing bath). Use in a wash bath would be uneconomical but is possible in principle.

The required concentration of the conditioner is from 0.001 to 1, preferably from 0.01 to 0.2, % by weight. The bath temperature should preferably be from 20° to 50° C. and the bath should be used for from 15 sec to 30 min, preferably from 2 to 10 min.

The conditioners to be used according to the invention are suitable for the pretreatment of a very wide range of materials to be chemically metallized, for example for the pretreatment of articles of phenol resin/-paper, epoxy resin, polystyrene, polyamide, polyethylene, polyvinyl chloride, polycarbonates, polyacrylates, polyesters, polysulfones or polytetrafluoroethylene, if necessary reinforced or filled with glass, minerals or polymers in fabric, fiber or other form, or of glass or ceramic material.

The Examples which follow illustrate the effectiveness of the novel use of the polymeric conditioners.

The test was carried out using a commercial chemical copper product line with a palladium colloid activator and another with a copper colloid activator. The product lines each consist of:

| cleaner | |
|---|---|
| etching bath | (Etching of the copper coating) |
| pre-dip | (Pretreatment for colloid activation) |
| activator | (Pd colloid or Cu colloid) |
| stripper | (Removal of excess colloid) |
| chemical copper bath | (Deposition bath) |

The wash baths between each step are not shown in this list. The conditioners were each added to the cleaner bath in a concentration of 0.15% by weight. The individual baths each had a volume of 50 ml (test tube in thermostated water bath). The temperatures, the treatment times and the washes between the baths corresponded to the manufacturer's instructions. The following substrates were used:

pieces of woven glass fiber fabric, satin weave, basis weight 296 g/m², fixed at the edge with commercial adhesive.

Strips of glass fiber-reinforced epoxy resin printed circuit boards, FR4 (corresponding to Military Standard MilP-13949 E, Class GFGF), laminated on both sides with copper foil and drilled.

The substrates were moved gently in the bath during the treatment.

The pieces of glass fiber fabric were each treated for 10 minutes in the deposition bath. After passing through the final wash bath, they were dipped in isopropanol and then dried with compressed air.

The pieces of printed circuit board were left in the deposition bath for 9 minutes in the product line operating with palladium colloid, and in the said bath for 7 minutes in the product line operating with copper colloid and were then dried with compressed air. A thin copper coating having a relatively large number of defects (holes) is obtained, although the effects of the conditioner are very readily detectable in the said coating. The copper coating of the holes of the pieces of printed circuit board was tested on ground sections, which were examined under the microscope in transmitted light. This method is described, inter alia, in the annual Oberflachentechnik 40 (1984), 122–133 (H.-J. Ehrich: Vorteile der alkalischen Aktivierung zur Herstellung hochwertiger Leiterplatten).

The copper-coated substrates were evaluated on the basis of ratings:

| Rating | Evaluation |
|---|---|
| 0 | No deposition |
| 1 | Very poor (only partial deposition) |
| 2 | Poor (substantial transmission of light) |
| 3 | Moderate |
| 4 | Satisfactory (suitable for production) |
| 5 | Good (few holes or little light transmission) |
| 6 | Very good (no holes or light transmission) |

It should once again be pointed out here that the intentionally thin copper coating results in poor absolute ratings when the pieces of printed circuit board are tested. The effect of the conditioners in this case is based on the differences between the ratings.

The following polymeric conditioners were tested:

I. Copolymer of piperazine and epichlorohydrin without quaternization

II. Copolymer I, 60% quaternized, based on N, with benzyl chloride.

| Example No. | Con- ditioner | Colloid Pd | Colloid Cu | Substrate Glass | Substrate Circuit board | Rat- ing | Effect = difference between ratings |
|---|---|---|---|---|---|---|---|
| Comp. 1 | — | X | | X | | 3 | — |
| 1 | I | X | | X | | 5 | 2 |
| 2 | II | X | | X | | 5 | 2 |
| Comp. 2 | — | X | | | X | 2–3 | — |
| 3 | I | X | | | X | 4–5 | 2 |
| Comp. 3 | — | | X | X | | 3–4 | — |
| 4 | II | | X | X | | 5–6 | 2 |

In a further test series, the abovementioned procedure was followed, except that, instead of the cleaner bath used in Examples 1 to 4 and Comparative Examples 1 to 3 and supplied to the product line, a cleaner bath having the following composition was used:
1.6% by weight of nonylphenol oxyethylate (14 EO),
0.6% by weight of triethanolamine,
0.02% by weight of polyvinylpyrrolidone having a K value of 30 and
0.04% by weight of sodium hydrogen phosphate,
the remainder to 100% by weight in water.

No conditioner was added to this bath in Comparative Example 4, but 0.5% by weight of the following conditioners was added in Comparative Examples 5 and 6 and Example 5 according to the invention.

COMPARISON 5

III. Copolymer of 30% by weight of acrylamide and 70% by weight of (2-acryloyloxyethyl)-trimethylammonium chloride (corresponding to U.S. Pat. No. 4,478,883).

COMPARISON 6

IV. Copolymer of 50% by weight of acrylamide and 50% by weight of (2-acryloyloxyethyl)-trimethylammonium chloride (corresponding to U.S. Pat. No. 4,478,883).

EXAMPLE 5

The copolymer designated as II above (corresponding to the invention).

The deposition time in the chemical copper bath was 15 minutes.

The following Table shows that Example 5 carried out according to the invention gives substantially better results than the Comparative Examples 5 and 6 carried out according to U.S. Pat. No. 4,478,883.

| Example No. | Con- ditioner | Colloid Pd | Substrate Glass | Rating | Effect = difference between ratings |
|---|---|---|---|---|---|
| Comp. 4 | — | X | X | 0–1 | — |
| Comp. 5 | III | X | X | 1 | 0.5 |
| Comp. 6 | IV | X | X | 1–2 | 1 |
| 5 | II | X | X | 5 | 4.5 |

We claim:

1. A process for chemically metallizing a nonmetallic surface of a molding, which comprises the following steps:
   (a) cleaning said surface;
   (b) activating said surface with a metal colloid dispersed in an aqueous medium;
   (c) stripping any excess colloid from said surface; and
   (d) chemically depositing a metal on said surface; wherein, at any time before process step (b), said surface is treated with a conditioner in aqueous solution, which is one or more polymeric condensates which contain repeating units of the formula

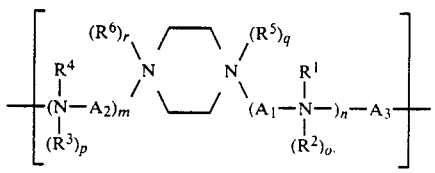

where $A_1$ and $A_2$ are each $C_2$–$C_4$-alkylene, $A_3$ is unsubstituted or hydroxyl-substituted $C_2$–$C_4$-alkylene, $R^1$ and $R^4$ are each hydrogen, $C_1$–$C_{12}$-alkyl or benzyl, $R^2$ and $R^3$ are each $C_1$–$C_{12}$-alkyl or benzyl, $R^5$ and $R^6$ are each $C_1$–$C_{12}$-alkyl, hydroxyl-substituted $C_2$–$C_{12}$-alkyl or benzyl and n, m, o, p, q and r are each zero or 1.

2. The process of claim 1, wherein said conditioner is a polymeric condensate which contains repeating units of the formula

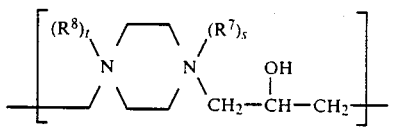

wherein $R^7$ and $R^8$ independently of one another are each $C_1$–$C_{12}$-alkyl or benzyl and s and t independently of one another are each zero or 1.

3. The process of claim 1, wherein said conditioner is a polymeric condensate of piperazine and an epihalohydrin, from 0 to 100% of whose nitrogen atoms have been quaternized with $C_1$–$C_{12}$-alkyl groups or from 0 to 80% of whose nitrogen atoms have been quaternized with benzyl groups, in the form of a salt which is soluble in the aqueous bath used.

4. The process of claim 1, wherein said surface is treated for from 15 seconds to 30 minutes with an aqueous solution which contains from 0.001 to 1% by weight of said conditioner and is at a temperature of from 10° to 60° C.

5. A process for chemically metallizing a nonmetallic surface of a molding on which a metal layer is present on a portion of said surface, which comprises the following steps:
   (a) cleaning said surface;
   (b) etching said metal layer present on said portion of said surface;
   (c) activating said surface with a metal colloid dispersed in an aqueous medium;
   (d) stripping any excess colloid from said surface; and
   (e) chemically depositing a metal on said surface, and in which, at any time before process step (c), said surface is treated with a conditioner in aqueous solution, which is one or more polymeric condensates which contain repeating units of the formula

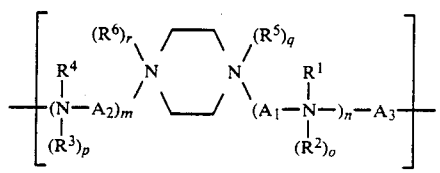

where $A_1$ and $A_2$ are each $C_2$–$C_4$-alkylene, $A_3$ is unsubstituted or hydroxyl-substituted $C_2$–$C_4$-alkylene, $R^1$ and $R^4$ are each hydrogen, $C_1$–$C_{12}$-alkyl or benzyl, $R^2$ and $R^3$ are each $C_1$–$C_{12}$-alkyl or benzyl, $R^5$ and $R^6$ are each $C_1$–$C_{12}$-alkyl, hydroxyl-substituted $C_2$–$C_{12}$-alkyl or benzyl and n, m, o, p, q and r are each zero or 1.

6. The process of claim 5, wherein said conditioner is a polymeric condensate which contains repeating units of the formula

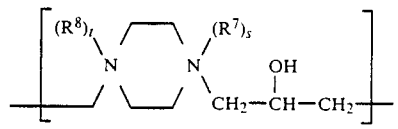

wherein $R^7$ and $R^8$ independently of one another are each $C_1$–$C_{12}$-alkyl or benzyl and s and t independently of one another are each zero or 1.

7. The process of claim 5, wherein said conditioner is a polymeric condensate of piperazine and an epihalohydrin, from 0 to 100% of whose nitrogen atoms have been quaternized with $C_1$–$C_{12}$-alkyl groups or from 0 to 80% of whose nitrogen atoms have been quaternized with benzyl groups, in the form of a salt which is soluble in the aqueous bath used.

8. The process of claim 5, wherein said surface is treated for from 15 seconds to 30 minutes with an aqueous solution which contains from 0.001 to 1% by weight of said conditioner and is at a temperature of from 10° to 60° C.

* * * * *